(12) United States Patent
Boles et al.

(10) Patent No.: US 12,112,983 B2
(45) Date of Patent: Oct. 8, 2024

(54) ATOMIC LAYER DEPOSITION OF BARRIER METAL LAYER FOR ELECTRODE OF GALLIUM NITRIDE MATERIAL DEVICE

(71) Applicant: MACOM Technology Solutions Holdings, Inc., Lowell, MA (US)

(72) Inventors: Timothy E. Boles, Tyngsboro, MA (US); Wayne Mack Struble, Franklin, MA (US); Gabriel R. Cueva, Bedford, NH (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 161 days.

(21) Appl. No.: 17/003,616

(22) Filed: Aug. 26, 2020

(65) Prior Publication Data

US 2022/0068708 A1    Mar. 3, 2022

(51) Int. Cl.
*H01L 21/768* (2006.01)
*H01L 21/8234* (2006.01)
(Continued)

(52) U.S. Cl.
CPC .............. *H01L 21/76841* (2013.01); *H01L 21/823437* (2013.01); *H01L 23/53223* (2013.01); *H01L 29/2003* (2013.01); *H01L 29/42372* (2013.01)

(58) Field of Classification Search
CPC ....... H01L 21/76841; H01L 21/823437; H01L 23/53223; H01L 29/2003; H01L 29/42372;
(Continued)

(56) References Cited

U.S. PATENT DOCUMENTS 11,398,406 B2 * 7/2022 Kuo ................ H01L 23/53238
11,508,667 B1 * 11/2022 Karp ..................... H01L 23/50
(Continued)

FOREIGN PATENT DOCUMENTS

CN       111326574 A       6/2020
CN       114078815 A  *    2/2022    ....... H01L 21/76802
(Continued)

OTHER PUBLICATIONS

European Search Report for Application No. 21191168.0 mailed Jan. 17, 2022.
(Continued)

*Primary Examiner* — Douglas W Owens
(74) *Attorney, Agent, or Firm* — Perilla Knox & Hildebrandt LLP; Jason M. Perilla (57) ABSTRACT

An electrode structure for a device, such as a GaN or AlGaN device is described. In one example, a method to form the structure includes providing a substrate including gallium nitride material, forming an insulating layer over a surface of the substrate, forming an opening in the insulating layer to expose a surface region of the substrate, depositing a barrier metal layer over the insulating layer and onto the surface region of the substrate through the opening, and depositing a conducting metal layer over the barrier metal layer. In one case, the barrier metal layer includes a layer of tungsten nitride. The layer of tungsten nitride is deposited over the insulating layer and onto the surface region of the substrate using atomic layer deposition.

19 Claims, 6 Drawing Sheets

(51) Int. Cl.
*H01L 23/532* (2006.01)
*H01L 29/20* (2006.01)
*H01L 29/423* (2006.01)

(58) Field of Classification Search
CPC .............. H01L 29/475; H01L 29/42316; H01L 29/778
See application file for complete search history.

(56) References Cited

U.S. PATENT DOCUMENTS

| | | | |
|---|---|---|---|
| 11,676,898 B2* | 6/2023 | Kuo | H01L 21/02458 257/751 |
| 2008/0000678 A1* | 1/2008 | Johnston | C25D 5/022 174/262 |
| 2008/0054472 A1* | 3/2008 | Shinriki | H01L 21/76843 438/650 |
| 2014/0327140 A1* | 11/2014 | Zhang | H01L 21/28562 438/653 |
| 2015/0108646 A1* | 4/2015 | Chae | H01L 21/76843 438/653 |
| 2016/0013276 A1 | 1/2016 | Morishita et al. | |
| 2016/0079404 A1 | 3/2016 | Fujii et al. | |
| 2017/0358670 A1 | 12/2017 | Kub et al. | |
| 2019/0378957 A1* | 12/2019 | El-Ghoroury | H01L 33/44 |
| 2020/0006132 A1* | 1/2020 | Kuo | H01L 21/28562 |
| 2021/0104433 A1* | 4/2021 | Mukherjee | C23C 16/045 |
| 2021/0375776 A1* | 12/2021 | Ho | H01L 21/76832 |
| 2022/0037202 A1* | 2/2022 | Lin | H01L 21/76874 |
| 2022/0050150 A1* | 2/2022 | Chien | H01L 43/12 |
| 2022/0216227 A1* | 7/2022 | Rha | H01L 27/11582 |

FOREIGN PATENT DOCUMENTS

| | | |
|---|---|---|
| TW | 201314949 A | 4/2013 |
| WO | 2013108844 A1 | 7/2013 |
| WO | WO-2020118185 A1 * | 6/2020 ......... H01L 21/0272 |

OTHER PUBLICATIONS

Office Action for Taiwanese Application No. 110131204 mailed Sep. 7, 2022.
Becker JS et al: "Highly Conformal Thin Films of Tungsten Nitride Prepared by Atomic Layer Deposition From a Novel Precursor", Chemistry of Materials, American Chemical Society, US, vol. 15, No. 15, Jul. 20, 2003 (Jul. 20, 2003), pp. 2969-2976, XP008049005, ISSN: 0897-4756, DOI: 10.1021/CM021772S.
Office Action from European Application No. 21191168.0 mailed Sep. 26, 2023.

* cited by examiner

ATOMIC LAYER DEPOSITION OF BARRIER METAL LAYER FOR ELECTRODE OF GALLIUM NITRIDE MATERIAL DEVICE

BACKGROUND

Devices formed from gallium nitride materials offer relatively high breakdown voltages, high electron mobility, and high saturation velocity. Gallium nitride (GaN) devices, for example, are good candidates for high-power and high-temperature microwave applications. GaN devices are particularly suitable for microwave radio-frequency power amplifiers, including those used in high-speed wireless data transmission and high-voltage switching devices for power conversion. GaN transistors maintain better performance at higher temperatures than silicon transistors, because the large band gap of GaN transistors leads to a reduction in the generation of charge carriers inherent in semiconductors. Various types of GaN devices are being actively developed today.

SUMMARY

Various embodiments of an electrode structure for devices are described, along with methods of manufacture of the same. In one example, a method to form the structure includes providing a substrate including gallium nitride material, forming an insulating layer over a surface of the substrate, forming an opening in the insulating layer to expose a surface region of the substrate, depositing a barrier metal layer over the insulating layer and onto the surface region of the substrate through the opening, and depositing a conducting metal layer over the barrier metal layer. In one case, the barrier metal layer includes a layer of tungsten nitride. The barrier metal layer prevents lower barrier height metals in the conducting metal layer, for example, from reaching the surface of the gallium nitride material substrate. In one aspect of the embodiments, the method to form the electrode structure includes depositing the barrier metal layer over the insulating layer and onto the surface region of the substrate using atomic layer deposition. The barrier metal layer can be tungsten nitride in one example. In another aspect, the method includes sputtering the conductive metal layer over the barrier metal layer. The conducting metal layer can be aluminum in one example, although other metals can be relied upon. The method can also include depositing a cap metal layer over the conducting metal layer using sputtering. The cap metal layer can be at least one of titanium nitride, tungsten, and tungsten nitride, although other metals can be relied upon.

In other aspects, the method can also include forming a cap etch photoresist layer over a region of the cap metal layer. After the cap etch photoresist layer is formed, the method can include etching the cap metal layer, the conducting metal layer, and the barrier metal layer down to the insulating layer over an area or region outside of the cap etch photoresist layer. The method can also include removing the cap etch photoresist layer.

In other embodiments, an electrode structure for a device is described. The electrode structure includes a substrate comprising a gallium nitride material layer, an insulating layer formed on the substrate, where the insulating layer comprising an opening that exposes a surface region of the substrate through the opening, a barrier metal layer on the surface region of the substrate and on a region of the insulating layer, and a conducting metal layer on the barrier metal layer.

In one aspect of embodiments, the barrier metal layer can be deposited on the surface region of the substrate using atomic layer deposition. In another aspect, the conductive metal layer can be deposited over the barrier metal layer using sputtering. The electrode structure can also include a cap metal layer on the conducting metal layer.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments.

DETAILED DESCRIPTION

Devices formed from gallium nitride materials offer relatively high breakdown voltages, high electron mobility, and high saturation velocity. As an example device formed from gallium nitride materials, GaN devices are good candidates for high-power and high-temperature microwave applications. GaN devices are particularly suitable for microwave radio-frequency power amplifiers, including those used for high-speed wireless data transmission. GaN transistors maintain better performance at higher temperatures than silicon transistors, because the large band gap of GaN transistors leads to a reduction in the generation of charge carriers inherent in semiconductors. Aluminum gallium nitride (AlGaN) devices, as another example, also offer benefits similar to those of GaN devices.

In some cases, high electron mobility transistor (HEMT) devices produced in group III-V foundries use a gate metal stack including nickel and gold, a gate metal stack including nickel, palladium, and gold, or a gate metal stack including nickel, platinum, and gold, deposited using evaporation.

These metals all have a high barrier height on gallium nitride materials. In silicon foundries, however, gold is not permitted in the gate metal stack, as gold is a rapid diffuser in silicon, so aluminum is typically used as the high conductivity metal. However, because aluminum is a low barrier height metal on gallium nitride materials, a barrier metal layer should be used in the gate metal stack to isolate the aluminum from the gallium nitride materials.

Tungsten nitride, for example, is a good choice for the barrier metal layer because it has a high barrier height on gallium nitride materials, and the nitrogen in the tungsten nitride fills grain boundaries, preventing diffusion of aluminum to the surface of the gallium nitride materials, when aluminum is formed over the tungsten nitride barrier layer. Additional considerations must also be accounted for in the selection of the process steps used to deposit the metal layers for an electrode formed at the surface region of gallium nitride materials. In this context, the embodiments described herein propose a particular set of metal layers and processing steps to deposit the metal layers for an electrode structure on a substrate. The approach can be particularly suitable for use in silicon foundries, because the use of gold is avoided.

To form an electrode structure according to the concepts described herein, a barrier metal layer can be formed through an opening in an insulating dielectric material over a GaN material substrate. The barrier metal layer can be a layer of tungsten nitride formed by atomic layer deposition in one example. One or more layers, such as conducting and cap metal layers, can also be formed over the barrier metal layer by sputtering. The type(s) of metal(s) in the metal layers of the electrode structure can be chosen for specified properties, such as barrier height, to optimize the performance of the resulting device. Schottky contacts for diodes, transistors, or other types of devices can be formed using the concepts described herein.

Figure 1:
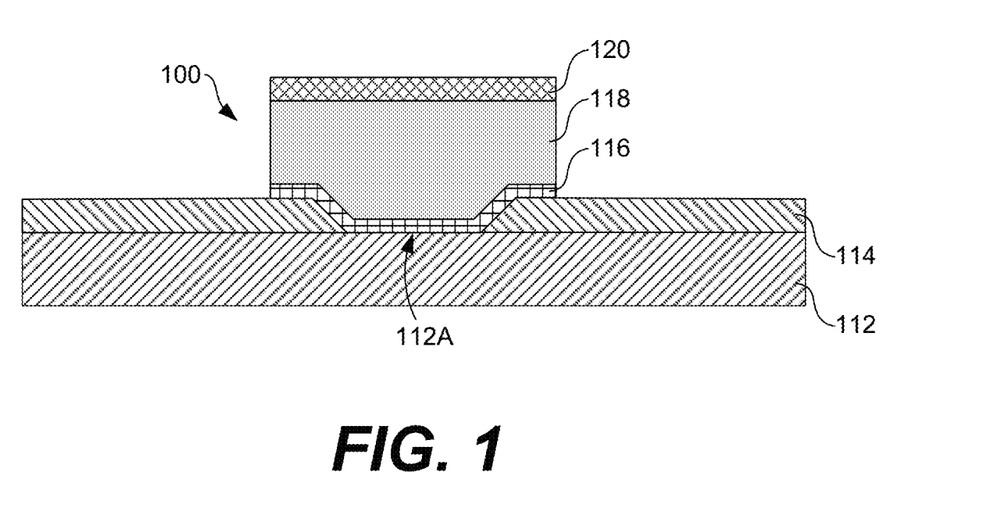
FIG. 1 illustrates an example electrode structure for a device according to various embodiments described herein.

FIG. 1 illustrates an example electrode structure 100 for a device according to various embodiments described herein. The device can be embodied as a GaN material HEMT device, such as a GaN material HEMT transistor, diode, or other device, and the concepts described herein can be applied to other types of related devices. The electrode structure 100 is illustrated as a representative example in FIG. 1. The shapes and relative sizes of the layers of the electrode structure 100 are not necessarily drawn to scale in FIG. 1. Example dimensions of the electrode structure 100 are described in further detail below, but the sizes of the layers in the electrode structure 100 are not specifically limited. The layers shown in FIG. 1 are also not exhaustive, and any device(s) incorporating the electrode structure 100 can include other layers and other elements not separately illustrated. Additionally, the electrode structure 100 can be formed as part of a larger integrated circuit device in combination with other devices and circuit elements. A larger integrated circuit device of this type may include several other electrodes similar to the electrode structure 100.

Among other structural elements, the electrode structure 100 includes a substrate 112, an insulating layer 114, a barrier metal layer 116, a conducting metal layer 118, and a cap metal layer 120. The substrate 112 can be embodied as a substrate including one or more layers of GaN materials as the top layer or layers the substrate. For example, the substrate 112 can include one or more layers of GaN, AlGaN, or GaN and AlGaN material layers formed on a silicon, silicon carbide, or another type of substrate.

The insulating layer 114 can include a layer of insulating dielectric, such as silicon nitride (SiN), silicon dioxide ($SiO_2$), aluminum oxide ($Al_2O_3$), hafnium dioxide ($HfO_2$), and other insulating dielectrics, including high-k dielectrics. As shown in FIG. 1, a surface region 112A of the substrate 112 is exposed through an opening in the insulating layer 114. The exposed surface region 112A can include an exposed region of GaN material. Electrical contact with the surface region 112A of the substrate 112 can be achieved through the opening in the insulating layer 114. Thus, an electrode including one or more layers of metals can be formed at the surface region 112A of the substrate 112 through the opening in the insulating layer 114, as described below.

The barrier metal layer 116, conducting metal layer 118, and cap metal layer 120 can form a gate connected field plate (GCFP) for a GaN HEMT, as one example of an electrode formed at the surface region 112A of the substrate 112. In one example described below, the barrier metal layer 116 includes a layer of tungsten nitride, the conducting metal layer 118 includes a layer of aluminum, and the cap metal layer 120 includes a layer of titanium nitride, although other metals can be used for certain layers in some cases.

As shown in FIG. 1, the barrier metal layer 116 is formed on and contacts the surface region 112A of the substrate 112. The barrier metal layer 116 also extends over a portion or region of the insulating layer 114, but the barrier metal layer 116 does not extend over the entire top surface of the insulating layer 114 in FIG. 1. Neither the conducting metal layer 118 nor the cap metal layer 120 contact the insulating layer 114 or the substrate 112.

It is also noted that the barrier metal layer 116 is formed on and contacts the surface region 112A, the conducting metal layer 118 is formed on and contacts the barrier metal layer 116, and the cap metal layer 120 is formed on and contacts the conducting metal layer 118 in one preferred example. However, in other examples, the conducting metal layer 118 can be formed over the barrier metal layer 116, and the cap metal layer 120 can be formed over the conducting metal layer 118. That is, additional layers of metal and/or metal alloys can be interleaved or found between or among one or more of the barrier metal layer 116, the conducting metal layer 118, and the cap metal layer 120.

Although not shown in FIG. 1, certain dimensions of the electrode structure 100 can also be defined through etching. For example, as described in further detail below, the width of the barrier metal layer 116, the conducting metal layer 118, and the cap metal layer 120 in the GCFP can be defined through the use of a photoresist mask and etching down to the surface of the insulating layer 114. Other dimensions of the electrode structure 100 are described in further detail below, but the sizes of the layers in the electrode structure 100 are not specifically limited.

A number of considerations must be accounted for in the selection of the metal layers used for the electrode structure 100, which may be formed as a GCFP of a GaN HEMT. As one example, a low resistance is desirable along the gate fingers of a GaN HEMT to improve radio frequency (RF) gain. Thus, high conductivity metals should be included in the metal layers of the gate contact to increase conductivity. For low leakage, high current operations, gate contacts on GaN materials generally require high barrier height metals. As examples, platinum (Pt), nickel (Ni), palladium (Pd), gold (Au), tungsten (W), and tungsten nitride (WN) offer relatively high barrier heights with relatively low leakage currents, even at high, maximum operating currents $I_{max}$.

For its high conductivity, gold is often used in the metal stack for electrodes of devices formed on GaN materials. Group III-V foundries often use layers of Ni and Au, layers of Ni, Pd, and Au, or layers of Ni, Pt, and Au for gate electrodes and contacts. In silicon foundries, however, gold is not generally permitted in the metal stack, as gold is a rapid diffuser in silicon. As a substitute for gold, aluminum can be used as a high conductivity metal. However, aluminum is a low barrier height metal on GaN materials. Low barrier height metals, such as aluminum (Al), titanium (Ti), tantilum (Ta), chromium (Cr), indium (In), niobium (Nb), and silver (Ag), can result in relatively higher leakage currents at lower operating currents, leading to lower $I_{max}$ currents. Thus, these lower barrier height metals should be kept away from the surfaces of GaN materials, including the surface region 112A of the substrate 112.

According to aspects of the embodiments, the electrode structure 100 includes the barrier metal layer 116 to prevent the conducting metal layer 118 from reaching the surface region 112A of the substrate 112. The barrier metal layer 116 can be particularly helpful if a low barrier height metal, such as aluminum, is used as the conducting metal layer 118. In this case, the barrier metal layer 116 prevents the low barrier height metal from reaching the surface of the GaN material (e.g., by diffusing along grain boundaries of the gate metal under high temperature transistor operation). In one preferred embodiment, the barrier metal layer 116 can include a layer of WN. WN offers good thermal stability for diodes, transistors, and other devices, and WN can be formed from precursors using atomic layer deposition, as described in further detail below.

Additional considerations must also be accounted for in the selection of the process steps used to deposit the metal layers for the electrode formed at the surface region 112A of the substrate 112. The high barrier height metals identified above can be deposited using physical vapor deposition techniques, such as by reactive evaporation or sputtering. For example, Pt, Ni, and Pd can be deposited on GaN material substrates using reactive evaporation, WN can be deposited using sputtering, and W can be deposited by either reactive evaporation or sputtering. Evaporation is generally preferred over sputtering to avoid crystal damage to GaN materials, although even evaporation can lead to crystal damage, dangling bonds, and surface traps. While it can be possible to repair crystal damage to GaN materials using a high temperature annealing step, this annealing step can also degrade the insulating layer 114. Thus, the use of reactive evaporation and sputtering can be problematic to form the barrier metal layer 116. To address those concerns, the barrier metal layer 116 can be deposited over the insulating layer 114 and onto the surface region 112A of the substrate 112 using atomic layer deposition, as described in further detail below, according to other aspects of the embodiments.

Figure 2:
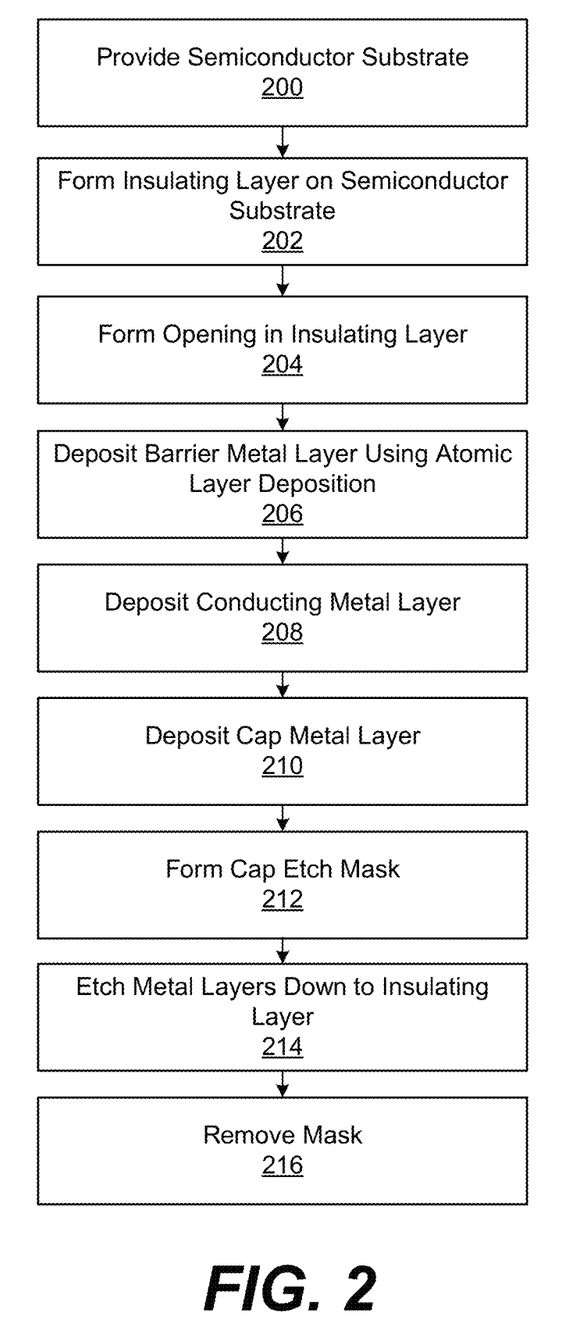
FIG. 2 illustrates an example method of forming the electrode structure shown in FIG. 1 according to various embodiments described herein.

FIG. 2 illustrates an example method or process of forming the electrode structure 100 shown in FIG. 1 according to various embodiments described herein. Although the method illustrates a specific order of steps in FIG. 2, the order of the steps can differ from that which is depicted. For example, two or more steps shown in succession can be performed, at least in part, at the same time. In some cases, one or more of the steps can be skipped or omitted. In other cases, additional steps not shown in FIG. 2 can be relied upon, such as steps among or after the steps shown in FIG. 2.

At step 200, the process includes providing a substrate comprising at least one gallium nitride material layer. Referring to the example shown in FIG. 3, the substrate 112 is illustrated as one example of a substrate that can be provided at step 200. The substrate 112 can include one or more layers of GaN, AlGaN, or GaN and AlGaN material layers formed over a silicon, silicon carbide, or another type of substrate. The substrate 112 can be manufactured using Hydride Vapor Phase Epitaxy (HVPE) process steps, sourced from a vendor, or formed or provided in any other suitable way at step 200.

Figure 3:
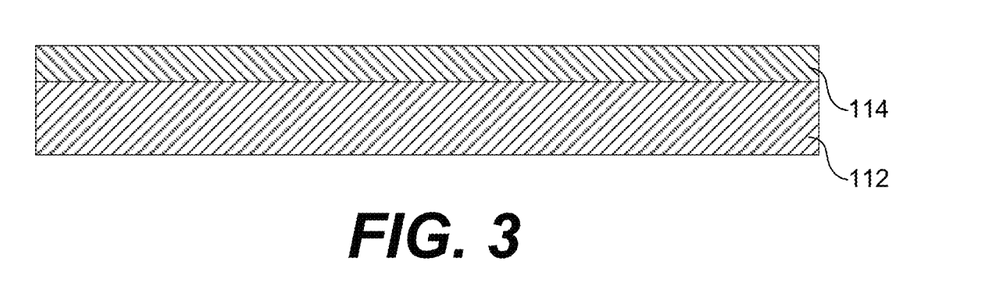
FIG. 3 illustrates an example substrate and insulating dielectric layer according to various embodiments described herein.

At step 202, the process includes forming an insulating layer on a top surface of the substrate provided at step 200. Here, the insulating layer 114 can be formed on the top surface of the substrate 112, as shown in FIG. 3. In one example, the insulating layer 114 can include a layer of SiN formed on the substrate 112 using plasma-enhanced chemical vapor deposition (PECVD), although other process steps can be used. In other examples, the insulating layer 114 can include a layer of $SiO_2$, a layer of $Al_2O_3$, a layer of $HfO_2$, or another layer of insulating dielectric, including a high-k dielectric. In one example, the insulating layer 114 can be formed at a thickness of about 900-1025 angstroms (Å), although other ranges can be relied upon.

Figure 4:
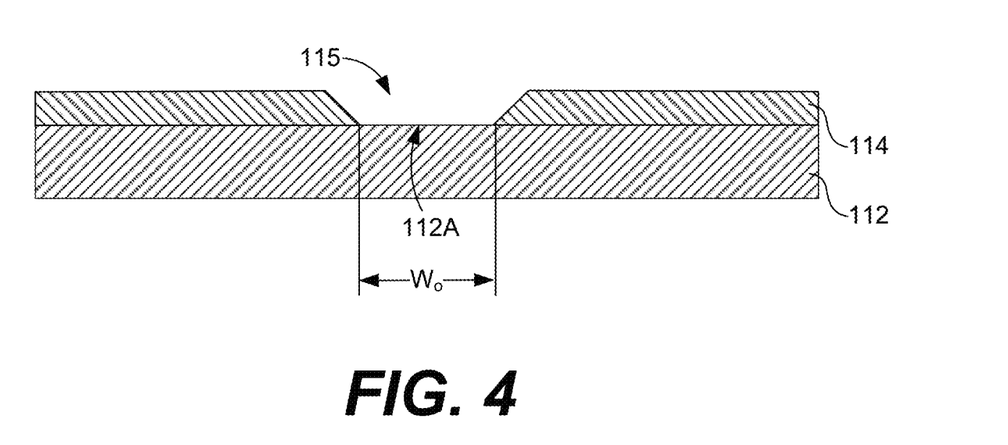
FIG. 4 illustrates an example opening in the insulating dielectric layer shown in FIG. 3, to expose a surface region of the substrate through the opening according to various embodiments described herein.

At step 204, the process includes forming an opening in the insulating layer formed at step 402. Referring to the example shown in FIG. 4, the opening 115 can be formed in the insulating layer 114. Step 204 can result in the exposure of the surface region 112A of the substrate 112. The exposed surface region 112A can include an exposed region of GaN material. The opening 115 can have a width ($W_o$) at the top surface of the substrate 212 (i.e., as measured right to left on the page), which defines a size of the surface region 112A in at least one dimension. As an example, the width ($W_o$) of the opening 115 can be 0.5 μm, although other sizes are within the scope of the embodiments. The opening 115 can also be defined in other dimensions, such as by its length (i.e., by depth into the page), which can be larger than 0.5 μm. The opening 115 can be formed by etching a trench in the insulating layer 114 or by using another suitable technique. The walls of the opening 115 may be tapered to some extent as shown in FIG. 4 or relatively more vertical than those shown, depending on the manner in which the opening 115 is formed.

At step 206, the process includes depositing a barrier metal layer over the insulating layer and onto the surface region of the substrate through the opening in the insulating layer. Referring to the example shown in FIG. 5, the barrier metal layer 116 is deposited over the insulating layer 114 and onto the surface region 112A of the substrate 112, through the opening 115 in the insulating layer 114. Here, the barrier metal layer 116 can be deposited as a thin layer of WN, for example, over the insulating layer 114 and onto the surface region 112A by atomic layer deposition. The barrier metal layer 116 is deposited on the surface of GaN material at step 206, in one example, when the substrate 112 includes one or more layers of GaN materials. The use of atomic layer deposition rather than sputtering at step 206 eliminates the crystal damage, dangling bonds, and surface traps commonly attributed to sputter/plasma damage, resulting in better reliability for the resulting electrode structure. Once a sufficient thickness of the barrier metal layer 116 has been deposited at step 206, additional layers of metal can be sputtered in subsequent steps without damaging the underlying substrate 112 as described above.

Figure 5:
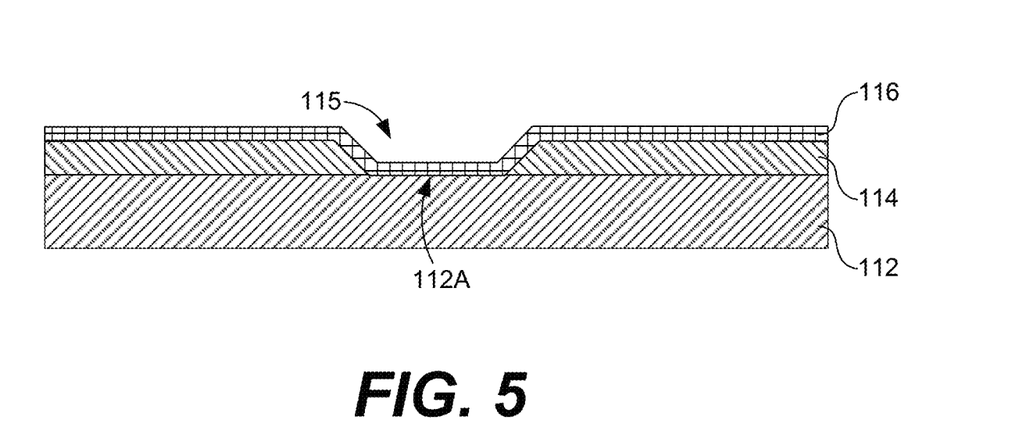
FIG. 5 illustrates an example barrier metal layer formed over the insulating dielectric layer and the surface region of the substrate according to various embodiments described herein.

The barrier metal layer 116 can be deposited by exposing the insulating layer 114 and the surface region 112A of the substrate 112 to alternate gaseous species of W and N precursors in an atomic deposition reactor. The W and N precursors are not present simultaneously in the atomic deposition reactor. Instead, the W and N precursors are introduced in a controlled manner, using a series of sequential, non-overlapping pulses of precursors. In each pulse, the precursor molecules react with the surface in a self-limiting way, so that the reaction terminates once all the reactive sites on the surface are consumed.

By controlling the number of pulse cycles at step 206, it is possible to deposit the barrier metal layer 116 uniformly and with a high level of precision over the insulating layer 114 and onto the surface region 112A. The barrier metal layer 116 can be formed essentially without pin holes or other defects in this way. As shown in FIG. 5, the barrier metal layer 116 is deposited throughout the top surface of the insulating layer 114 and the surface region 112A. In one example, the barrier metal layer 116 can be deposited at a thickness of about 400 Å. In other examples, the barrier metal layer 116 can be deposited at a thickness from about 200-500 Å, and other ranges can be relied upon.

At step 208, the process includes depositing a conducting metal layer over the barrier metal layer. Referring to the example shown in FIG. 6, the conducting metal layer 118 is deposited over the barrier metal layer 116 using sputtering. The conducting metal layer 118 can be deposited throughout the top surface of the barrier metal layer 116, completely covering the barrier metal layer 116. The conducting metal layer 118 can include a layer of Al, as one preferred embodiment, although other high conductivity metals can be relied upon. In one example, the conducting metal layer 118 can be deposited at a thickness of about 6000 Å. In other examples, the conducting metal layer 118 can be deposited at a thickness from about 5800-6200 Å, and other ranges can be relied upon.

Figure 6:
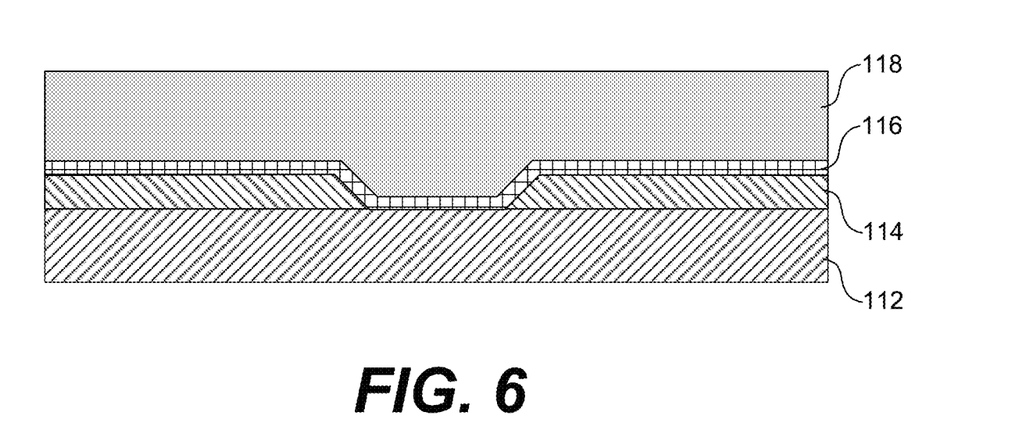
FIG. 6 illustrates an example conducting metal layer formed over the barrier metal layer according to various embodiments described herein.

During step 208, the barrier metal layer 116 protects the surface of the surface region 112A while the conducting layer 118 is formed by sputtering. The barrier metal layer 116 also prevents the conducting layer 118 from reaching the surface of the surface region 112A (e.g., by diffusing along grain boundaries of the gate metal under high temperature transistor operation).

Figure 7:
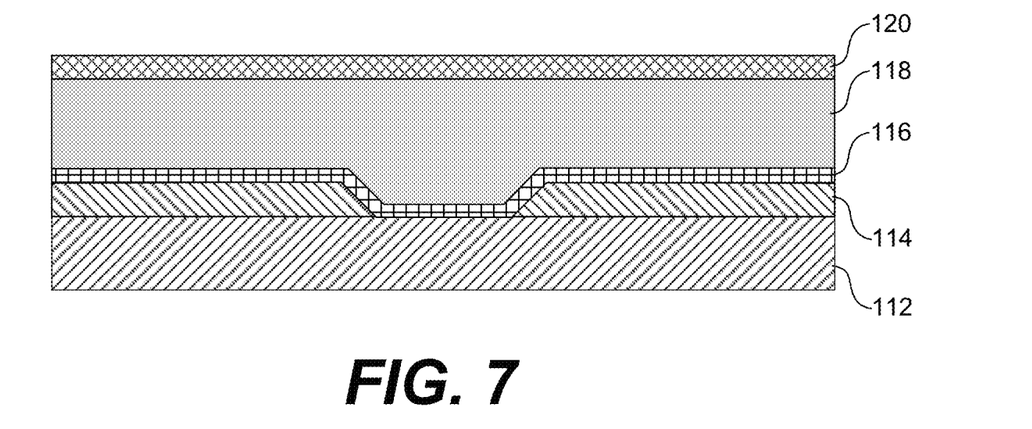
FIG. 7 illustrates an example cap metal layer formed over the conducting metal layer according to various embodiments described herein.

At step 210, the process includes depositing a cap metal layer over the conducting metal layer. Referring to the example shown in FIG. 7, the cap metal layer 120 is deposited over the conducting metal layer 118 using sputtering. The cap metal layer 120 can be deposited throughout the top surface of the conducting metal layer 118, completely covering the conducting metal layer 118. The cap metal layer 120 can include a layer of titanium nitride (TiN), as one preferred embodiment. As other examples, the cap metal layer 120 can include a layer of W or a layer of WN. In one example, the cap metal layer 120 can be deposited at a thickness of about 100 Å. In other examples, the cap metal layer 120 can be deposited at a thickness from about 80-120 Å, and other ranges can be relied upon.

Figure 8:
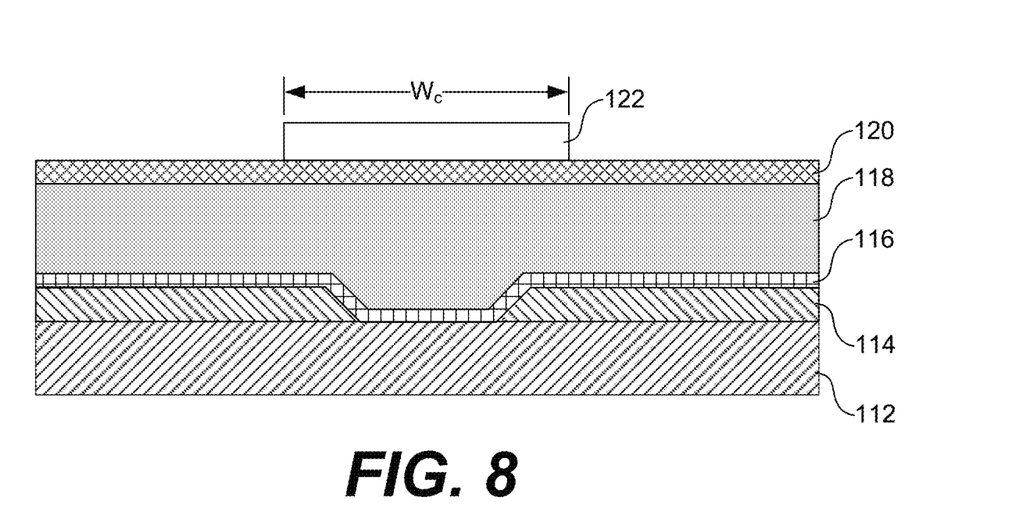
FIG. 8 illustrates an mask layer formed over the cap metal layer according to various embodiments described herein.

At step 212, the process includes forming a cap etch photoresist layer over a region of the cap metal layer deposited at step 210. Referring to FIG. 8, the cap etch photoresist layer or mask 122 is formed over the cap metal layer 120. The cap etch photoresist mask 122 can be formed at a width ($W_c$). The width ($W_c$) can be about 0.8 µm-1.2 µm (i.e., as measured right to left on the page), which will ultimately define a size of the electrode structure 100 in at least one dimension, although other sizes are within the scope of the embodiments. The overall size of the cap etch photoresist mask 122 can also be defined in other dimensions, such as by its length (i.e., by depth into the page), which can be larger than 0.8 µm-1.2 µm.

Figure 9:
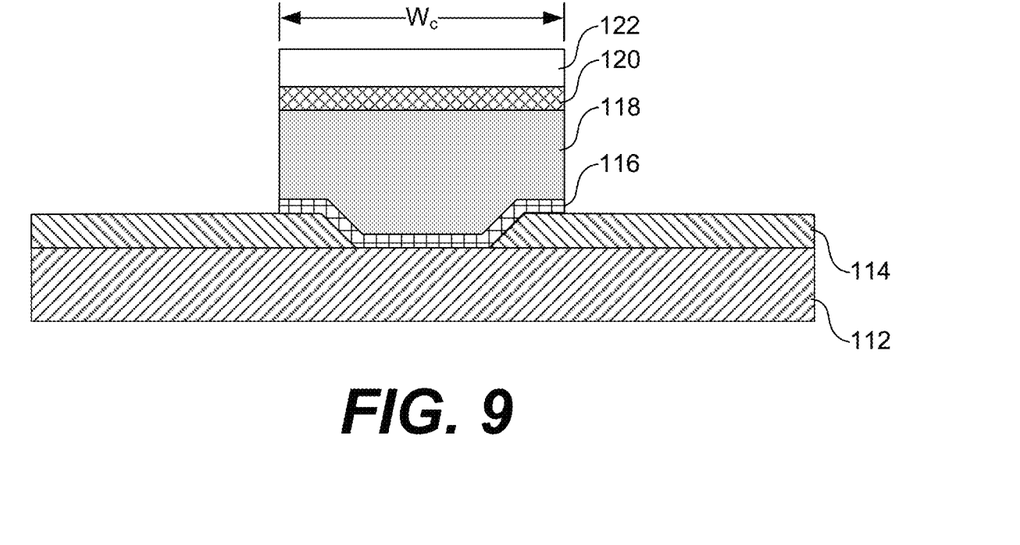
FIG. 9 illustrates an example electrode structure formed by etching the barrier layer, the conducting layer, and the cap metal layer around the mask layer according to various embodiments described herein.

At step 214, the process includes etching the cap metal layer formed at step 210, the conducting metal layer formed at step 208, and the barrier metal layer formed at step 206 down to the insulating layer 114. FIG. 9 illustrates how the cap metal layer 120, the conducting metal layer 118, and the barrier metal layer 116 have all been etched away over an area or region outside of the cap etch photoresist mask 122, leaving the structure under the cap etch photoresist mask 122 at step 212. Any suitable etching process steps, including dry etching, can be relied upon at step 212 to remove the metal layers over the region outside of the cap etch photoresist mask 122.

Figure 10:
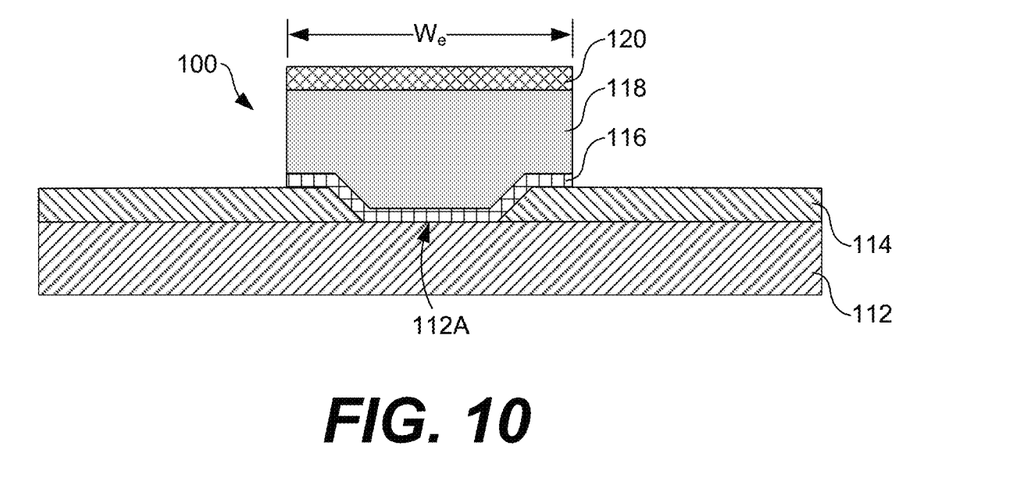
FIG. 10 illustrates an example electrode structure formed after removing the mask layer according to various embodiments described herein.

At step 216, the process can also include removing the cap etch photoresist layer or mask 122 to arrive at the electrode structure 100 shown in FIG. 10. The cap etch photoresist layer or mask 122 has been removed in FIG. 10. The width ($W_e$) of the electrode structure 100 can be between about 0.8 µm-1.2 µm in one dimension (i.e., as measured right to left on the page), for example, although other dimensions are within the scope of the embodiments. It should also be appreciated that the overall size of the electrode structure 100 can also be defined in other dimensions, such as by its length (i.e., by depth into the page), which can be larger than 0.8 µm-1.2 µm.

In FIG. 10, the height (i.e., as measured bottom to top on the page) of each layer can range in thickness from about 900-1025 Å for the insulating layer 114, from about 300-500 Å for the barrier metal layer 116, from about 5800-6200 Å for the conducting metal layer 118, and from about 80-120 Å for the cap metal layer 120. These vertical height ranges may be preferred, but the dimensions of the metal layers can vary for certain design needs.

The concepts described herein can be applied to group III-V direct bandgap active semiconductor devices, such as the III-Nitrides (aluminum (Al), gallium (Ga), indium (In), and alloys (Al/Ga/In) thereof based Nitrides), GaAs, InP, InGaP, AlGaAs, including HEMTs. The principles and concepts can also be applied to transistors and other active devices formed from other semiconductor materials, including but not limited to Si LDMOS.

The embodiments and concepts described herein are useful for manufacturing devices from semiconductor materials formed on or over silicon (e.g., GaN-on-Si transistors), silicon carbide (e.g., GaN-on-silicon carbide (SiC) transistors, as well as other types of substrate materials. As used herein, the phrase "gallium nitride material(s)" or "GaN material(s)" refers to gallium nitride and any of its alloys, such as aluminum gallium nitride ($Al_x Ga_{(1-x)} N$), indium gallium nitride ($In_y Ga_{(1-y)} N$), aluminum indium gallium nitride ($Al_x In_y Ga_{(1-x-y)} N$), gallium arsenide phosphide nitride ($GaAs_a P_b N_{(1-a-b)}$), aluminum indium gallium arsenide phosphide nitride ($Al_x In_y Ga_{(1-x-y)} As_a P_b N_{(1-a-b)}$), among others. The gallium nitride materials can be formed over a silicon, silicon carbide, or other type of substrate. The term "gallium nitride" or GaN semiconductor refers directly to gallium nitride, exclusive of its alloys.

The structures and methods described herein can be used to fabricate a wide variety of useful integrated circuits. For example, the electrodes described above can be integrated with various components in a monolithic circuit format suitable for microwave circuit applications. Although embodiments have been described herein in detail, the descriptions, including the dimensions states, are by way of example.

The features, structures, or characteristics described above may be combined in one or more embodiments in any suitable manner, and the features discussed in the various embodiments are interchangeable, if possible. In the foregoing description, numerous specific details are provided in order to fully understand the embodiments of the present disclosure. However, a person skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although relative terms of orientation, such as "above," "below," "upper," "lower," "under," and "over," may be used to describe the structural orientation of certain elements, the terms are used for convenience only, for example, as a direction in examples shown in the drawings. It should be understood that if the device is turned upside down, the "upper" component will become a "lower" component.

As used herein, terms such as "a," "an," "the," and "said" are used to indicate the presence of one or more elements and components. The terms "comprise," "comprising," "include," "including," "have," "having," "contain," "containing," and their variants are open ended and can include additional elements, components, etc., in addition to the listed elements, components, etc. unless otherwise specified. The terms "first," "second," etc. are used only as labels, rather than a limitation for a number of the objects.

The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. A method of manufacturing an electrode structure for a device, comprising:
    forming an insulating layer over a surface of a substrate;
    forming an opening in the insulating layer to expose a semiconductor material surface region of the substrate through the opening;
    depositing a barrier metal layer over the insulating layer and onto the semiconductor material surface region of the substrate through the opening in the insulating layer using atomic layer deposition;
    depositing a conducting metal layer over the barrier metal layer;
    depositing a cap metal layer over the conducting metal layer using sputtering;
    forming a cap etch photoresist layer over a region of the cap metal layer; and
    etching the cap metal layer, the conducting metal layer, and the barrier metal layer down to the insulating layer over an area outside of the cap etch photoresist layer.

2. The method according to claim 1, wherein depositing the barrier metal layer comprises depositing the barrier metal layer onto the insulating layer and onto the semiconductor material surface region of the substrate using atomic layer deposition.

3. The method according to claim 1, wherein the barrier metal layer comprises tungsten nitride.

4. The method according to claim 1, wherein depositing the conductive metal layer comprises sputtering the conductive metal layer over the barrier metal layer.

5. The method according to claim 1, wherein the conducting metal layer comprises aluminum.

6. The method according to claim 1, wherein the cap metal layer comprises at least one of titanium nitride, tungsten, and tungsten nitride.

7. The method according to claim 1, further comprising removing the cap etch photoresist layer.

8. The method according to claim 1, wherein:
    the substrate comprises a gallium nitride material layer;
    forming the opening in the insulating layer comprises exposing a surface region of the gallium nitride material layer; and
    depositing the barrier metal layer comprises depositing the barrier metal layer onto the surface region of the gallium nitride material layer.

9. A method of manufacturing an electrode structure for a device, comprising:
    providing a substrate comprising a gallium nitride material layer;
    forming an insulating layer over a surface of the gallium nitride material layer;
    forming an opening in the insulating layer to expose a surface region of the gallium nitride material layer through the opening;
    depositing a barrier metal layer over the insulating layer and onto the surface region of the gallium nitride material layer through the opening in the insulating layer using atomic layer deposition;
    depositing a conducting metal layer over the barrier metal layer; and
    depositing a cap metal layer of at least one of titanium nitride, tungsten, and tungsten nitride over the conducting metal layer using sputtering.

10. The method according to claim 9, wherein the barrier metal layer comprises tungsten nitride.

11. The method according to claim 9, wherein depositing the conductive metal layer comprises sputtering the conductive metal layer over the barrier metal layer.

12. The method according to claim 9, wherein the conducting metal layer comprises aluminum.

13. A method of manufacturing an electrode structure for a device, comprising:
    forming an opening in an insulating layer to expose a semiconductor material surface region of a substrate through the opening;
    depositing a barrier metal layer over the insulating layer and onto the semiconductor material surface region of the substrate through the opening using atomic layer deposition;
    depositing a conducting metal layer over the barrier metal layer using sputtering;
    depositing a cap metal layer over the conducting metal layer using sputtering; and
    etching the cap metal layer, the conducting metal layer, and the barrier metal layer down to the insulating layer over an area.

14. The method according to claim 13, wherein:
    the substrate comprises a gallium nitride material layer;
    forming the opening in the insulating layer comprises exposing a surface region of the gallium nitride material layer; and
    depositing the barrier metal layer comprises depositing the barrier metal layer onto the surface region of the gallium nitride material layer.

15. The method according to claim 13, wherein the conducting metal layer comprises aluminum.

16. The method according to claim 13, wherein the cap metal layer comprises at least one of titanium nitride, tungsten, and tungsten nitride.

17. The method according to claim 13, wherein the barrier metal layer comprises tungsten nitride.

18. The method according to claim 13, wherein:
the barrier metal layer comprises tungsten nitride;
the conducting metal layer comprises aluminum; and
the cap metal layer comprises at least one of titanium nitride, tungsten, and tungsten nitride.

19. The method according to claim 13, wherein depositing the barrier metal layer comprises depositing the barrier metal layer onto the insulating layer and onto the semiconductor material surface region of the substrate using atomic layer deposition.

\* \* \* \* \*